US006487063B1

United States Patent
Nakasuji (10) Patent No.: US 6,487,063 B1
(45) Date of Patent: Nov. 26, 2002

(54) ELECTROSTATIC WAFER CHUCK, AND CHARGED-PARTICLE-BEAM MICROLITHOGRAPHY APPARATUS AND METHODS COMPRISING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 109 days.

(21) Appl. No.: 09/715,445

(22) Filed: Nov. 16, 2000

(30) Foreign Application Priority Data

Nov. 16, 1999 (JP) .......................................... 11-325463

(51) Int. Cl.[7] .............................................. H01G 4/005
(52) U.S. Cl. ....................................................... 361/234
(58) Field of Search ................................. 361/234, 233, 361/235; 355/61

(56) References Cited

U.S. PATENT DOCUMENTS

| | | | | |
|---|---|---|---|---|
| 4,298,273 A | * | 11/1981 | Nishizuka et al. | 355/61 |
| 4,431,304 A | * | 2/1984 | Mayer | 355/54 |
| 4,558,949 A | | 12/1985 | Uehara et al. | |
| 4,692,836 A | * | 9/1987 | Suzuki | 361/234 |
| 5,452,177 A | * | 9/1995 | Fruitger | 361/234 |
| 5,572,398 A | * | 11/1996 | Federlin et al. | 361/234 |
| 5,634,231 A | * | 6/1997 | Nishi | 15/102 |
| 5,781,400 A | * | 7/1998 | Takahashi et al. | 361/234 |
| 5,880,923 A | * | 3/1999 | Hausmann | 361/234 |
| 5,914,568 A | * | 6/1999 | Nonaka | 315/111.21 |
| 5,946,184 A | * | 8/1999 | Kanno et al. | 361/234 |

FOREIGN PATENT DOCUMENTS

JP H01-240340 9/1989

* cited by examiner

Primary Examiner—Brian Sircus
Assistant Examiner—Z Kitov
(74) Attorney, Agent, or Firm—Klarquist Sparkman LLP (57) ABSTRACT

Electrostatic chucks are disclosed for holding a wafer or other substrate during microlithographic transfer of a pattern from a reticle to a surface of the substrate using a charged particle beam or other energy beam. The chucks are configured especially to hold the substrate easily and completely for better substrate planarity and better conduction of heat from the substrate to the chuck during exposure. An embodiment of the chuck includes a base plate including a first region and a second region. The first region includes a central region and a peripheral segment region, and the second region includes a general peripheral region that, in combination with the peripheral segment region, surrounds the central region. An insulating layer overlies the base plate and defines a wafer-mounting surface. First and second electrode sets are situated between the base plate and insulating layer. The first electrode set is located in the first region so as to occupy the central region and peripheral segment region, and the second electrode set is located in the second region so as to occupy the general peripheral region. When initiating attachment of the substrate to the chuck, the first electrode set is energized before energizing the second electrode set.

10 Claims, 4 Drawing Sheets

FIG. 5

ELECTROSTATIC WAFER CHUCK, AND CHARGED-PARTICLE-BEAM MICROLITHOGRAPHY APPARATUS AND METHODS COMPRISING SAME

FIELD OF THE INVENTION

This invention pertains to microlithography (transfer of an image of a pattern, defined by a reticle or mask, to a sensitive substrate using an energy beam). Microlithography is a key technique used in the manufacture of microelectronic devices such as integrated circuits, displays, and the like. More specifically, this invention pertains to microlithography performed using a charged particle beam, wherein pattern-image transfer is performed in a vacuum chamber. Even more specifically, the invention pertains to an electrostatic chuck to which the substrate (e.g., semiconductor wafer) is mounted during transfer of the pattern to the substrate.

BACKGROUND OF THE INVENTION

Charged-particle-beam (CPB) microlithography is performed in a vacuum chamber, with the substrate ("wafer") mounted to the surface of an electrostatic wafer chuck. Specifically, the underside of the wafer is mounted to an upstream-facing mounting surface of the chuck to present the resist-coated upstream-facing surface of the wafer for microlithography. Desirably, the wafer chuck holds the wafer such that the resist-coated surface is planar during microlithography. To such end, an attractive force between the mounting surface and the wafer typically is produced electrostatically. The electrostatic force is generated by electrically energizing electrodes situated beneath the mounting surface.

The wafer chuck should hold the wafer firmly and completely during microlithographic exposure. In actual practice, however, mounting difficulties can arise whenever the wafer is warped or otherwise deformed. For example, if the central region of the wafer domes "downward" (toward the mounting surface of the chuck), then the central region of the wafer is attached easily to the mounting surface of the chuck by energizing the electrodes. Also, as the more peripheral regions of the wafer are drawn progressively to the mounting surface, the center of the wafer tends to flatten. In contrast, whenever the central region of the wafer is domed "upward" (away from the mounting surface of the chuck), the initial strong attraction of the periphery of the wafer to the mounting surface of the chuck tends to prevent the central region of the wafer from being drawn toward the mounting surface of the chuck. As a result, the wafer, when mounted to the chuck surface, does not present a planar upstream-facing surface for microlithography.

A conventional electrostatic chuck configured to solve such a problem is disclosed in Japan Kôkai Patent Document No. Sho 60-95932. In this electrostatic chuck, an electrode situated on a round insulated base plate is covered with an insulation layer. The external upstream-facing surface of the insulation layer serves as the mounting surface of the chuck. The electrode is divided into a circular central region surrounded by a peripheral region. A voltage is applied first to the central-region electrode to draw the central region of the wafer under-surface toward the mounting surface of the chuck. After a specified delay time, a voltage is applied to the peripheral-region electrode to attach the peripheral region of the wafer under-surface to the chuck.

The following Equation (1) defines attachment force ("chuck power") P per unit of surface area of the mounting surface of the chuck:

$$P = \in_0 \in^{*2} V^2 / [2(d + \in^* x)^2] \tag{1}$$

wherein $\in_0$ s the dielectric constant of a vacuum, $\in^*$ is relative dielectric constant of the dielectric used to make the insulation layer of the chuck, V is the voltage applied to the chuck electrode (chuck voltage), d is the thickness of the insulation layer, and x is the thickness of a vacuum layer situated between the mounting surface of the chuck and the under-surface of the wafer.

As is apparent from Equation (1), a vacuum layer (having a thickness x) situated between the wafer and the mounting surface causes the effective thickness of the dielectric layer to be increased to greater than d. This causes a local corresponding decrease in chuck power P. To obtain maximal attachment force of the wafer to the mounting surface of the chuck, the vacuum layer ideally has a thickness x=0.

With a conventional electrostatic chuck, if the wafer periphery is warped downward to an extent not exceeding a certain threshold, then by applying a sufficiently high voltage to the electrodes of the chuck the wafer can be "flattened" sufficiently (by the central region of the wafer being attracted to the mounting surface) to cause substantially the entire under-surface of the wafer to contact the mounting surface. However, if such peripheral warping of the wafer exceeds the threshold, then a substantial vacuum-layer thickness x persists between the central region of the under-surface of the wafer and the mounting surface of the chuck. The vacuum layer causes a substantial decrease of chuck power P in the central region of the wafer, leaving the central region of the wafer actually not contacting the mounting surface. Meanwhile, even though the peripheral region of the wafer is attached to the mounting surface, the persistent vacuum layer beneath the central region of the wafer prevents, during exposure of the wafer, heat in the central region of the wafer from being conducted away by the chuck. Consequently, the wafer temperature rises sufficiently to cause significant thermal deformation of the wafer, making accurate pattern transfer very difficult or impossible to perform.

SUMMARY OF THE INVENTION

In view of the disadvantages of the prior art as summarized above, an object of the invention is to provide electrostatic wafer chucks configured to achieve easy and ready attachment of the entire downstream-facing surface of the wafer to the mounting surface of the chuck. Such attachment is achievable with comparatively small respective voltages being applied to the chuck electrodes, even whenever the wafer periphery is warped downward toward the mounting surface (i.e., whenever the central region of the wafer is domed away from the mounting surface). Another object is to provide charged-particle-beam (CPB) microlithography apparatus that comprise such a wafer chuck. Yet another object is to provide wafer-holding methods for CPB microlithography, including use of such a chuck.

To such end and according to a first aspect of the invention, electrostatic wafer chucks are provided. An embodiment of such a wafer chuck comprises a base plate, an insulating layer, and first and second electrodes. The base plate comprises a first region and a second region. The first region includes a central region and a peripheral segment region, and the second region includes a general peripheral region that, in combination with the peripheral segment region, surrounds the central region. The insulating layer overlies the base plate and defines a wafer-mounting surface of the chuck. The first and second electrode sets are situated between the base plate and insulating layer. The first electrode set is located in the first region so as to occupy the central region and peripheral segment region, and the second electrode set is located in the second region so as to occupy the general peripheral region. The chuck also includes a power supply connected to the first and second electrode sets. The power supply is configured, when starting energization of the chuck to hold a substrate to the wafer-mounting surface electrostatically, to electrically energize the first electrode set before energizing the second electrode set.

With such a wafer chuck, whenever the peripheral region of the wafer or other substrate (generally referred to herein as a "wafer") is warped toward the wafer-mounting surface, the peripheral region is attracted to the wafer-mounting surface. According to the invention, by electrically energizing (i.e., applying voltage to) the first electrode set in the first region before energizing the second electrode set in the second region, any gap between the wafer and the wafer-mounting surface is reduced automatically. I.e., a region on the periphery of the wafer is drawn strongly to the wafer-mounting surface, which tends to draw the central region of the wafer toward the wafer-mounting surface. Then, when the second electrode set is energized subsequently, the remainder of the periphery of the wafer is drawn to the wafer-mounting surface, thereby completing full contact of the wafer with the wafer-mounting surface. According to Equation (1) above, the chuck power P is increased substantially in the central region of the wafer compared to conventional wafer chucks. Also, since every part of the wafer is drawn into contact with the wafer-mounting surface, thermal conduction of heat from the wafer to the chuck is improved substantially compared to conventional wafer chucks. Consequently, thermal warping of the wafer is reduced and microlithographic-exposure accuracy is improved correspondingly.

Desirably, each of the first and second electrode sets comprises respective first and second electrodes. One of the electrodes in each electrode set is connected to a positive-voltage output of the power supply and the other electrode in each electrode set is connected to a negative-voltage output of the power supply. Further desirably, the first and second electrodes of the first electrode set have planar profiles that are mirror images of each other and have similar surface areas. Similarly, the first and second electrodes of the second electrode set have planar profiles that are mirror images of each other and have similar surface areas.

To achieve the temporal delay in energization of the second set of electrodes relative to the first set of electrodes, a delay circuit can be connected between the power supply and the second set of electrodes.

According to another aspect of the invention, charged-particle-beam (CPB) microlithography apparatus are provided. An embodiment of such an apparatus comprises an illumination-optical system, a projection-optical system, and an electrostatic wafer chuck as summarized above. The illumination-optical system is situated and configured to direct an illumination charged particle beam to a pattern-defining reticle so as to illuminate a region of the pattern on the reticle. The projection-optical system is situated and configured to direct an imaging beam, generated by passage of the illumination beam through the illuminated region of the reticle, from the reticle to a sensitive substrate. The wafer chuck is situated to hold the sensitive substrate as the sensitive substrate is being exposed with the pattern by the imaging beam.

According to yet another aspect of the invention, methods are provided, in the context of performing CPB microlithography of a pattern, defined by a reticle, onto a sensitive substrate, for holding the substrate. In an embodiment of such a method, an electrostatic wafer chuck is provided that includes a base plate, an insulating layer, and first and second electrode sets as summarized above. When initiating attachment of the substrate to the wafer chuck, the first electrode set is energized before energizing the second electrode set. To continue holding the substrate to the wafer-mounting surface, energization of both sets of electrodes is continued.

The foregoing and additional features and advantages of the invention will be more readily apparent from the following detailed description, which proceeds with reference to the accompanying drawings.

DETAILED DESCRIPTION

The invention is described below in the context of representative embodiments. It will be understood, however, that the invention is not limited to those embodiments. Also, certain aspects of the invention are described in the context of an electron beam as an exemplary charged particle beam. It will be understood that the general principles disclosed herein can be applied with ready facility to other types of charged particle beams, such as an ion beam.

Figure 4:
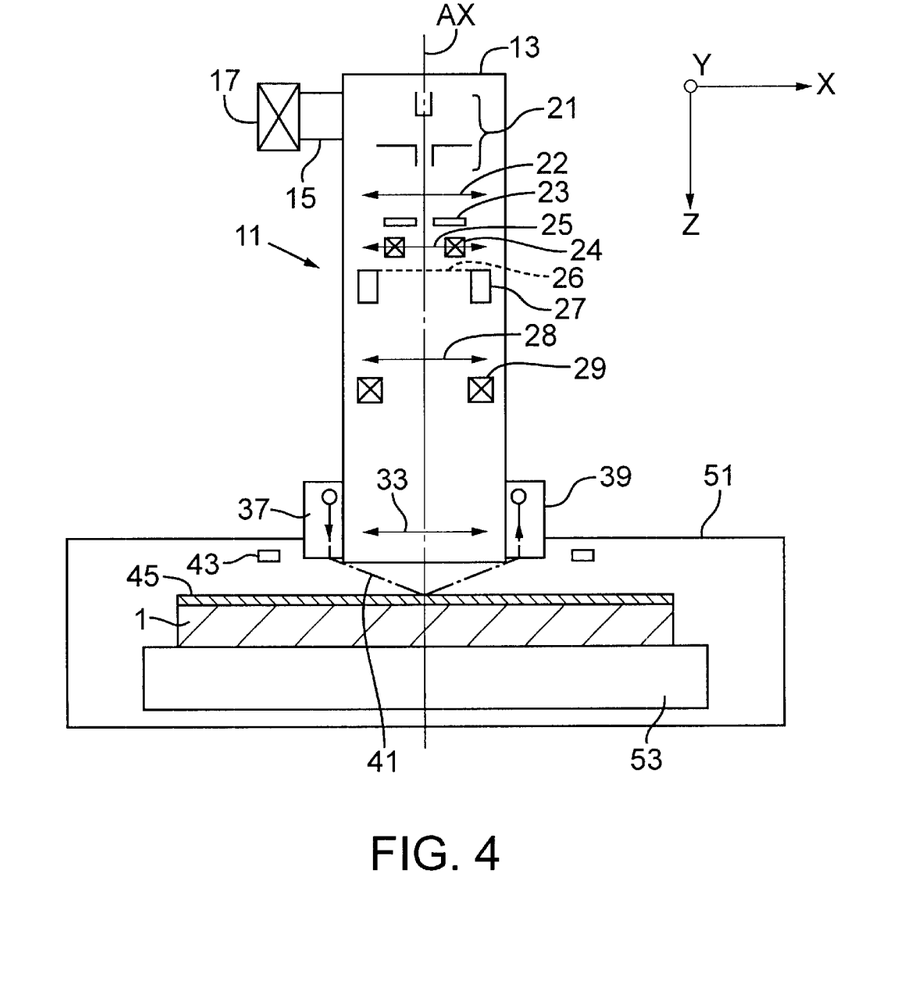
FIG. 4 is a schematic elevational diagram showing certain general aspects of a representative embodiment of a charged-particle-beam (CPB) microlithography apparatus, according to the invention, including an electrostatic wafer chuck such as that shown in FIG. 1.

Reference is made first to FIG. 4 depicting certain aspects of an embodiment of a "divided reticle" charged-particle-beam (CPB) microlithography apparatus 11 according to the invention. An electron beam is produced by an electron gun 21 situated at an extreme upstream end of the apparatus. The electron beam emitted by the electron gun 21 propagates in a downstream direction (downward in the figure). Situated downstream of the electron gun is a condenser lens 22 and a beam-shaping aperture 23. The beam-shaping aperture 23 trims the periphery of the electron beam to a transverse profile sufficient to illuminate a subfield (exposure unit) of a reticle 26. An image of the beam-shaping aperture 23 is formed on the reticle by an illumination lens 25. The condenser lens 22, illumination lens 25, and beam-shaping aperture 23 are components of an "illumination-optical system" situated upstream of the reticle 26. The electron beam, from the electron gun 21, passing through the illumination-optical system to the reticle 26 is termed the "illumination beam."

Situated downstream of the beam-shaping aperture 23 is a blanking deflector and blanking aperture (both not shown) and a subfield-selection deflector 24. The blanking deflector deflects the illumination beam relative to the blanking aperture as required in a manner such that the illumination beam is blocked by the blanking aperture (rather than passing through it), thereby preventing the illumination beam from propagating to the reticle 26. The subfield-selection deflector 24 mainly scans the illumination beam back and forth in the X-direction so as to illuminate subfields in successive rows of subfields on the reticle 26 in a sequential manner, within the visual field of the illumination-optical system.

The illumination lens 25 collimates the illumination beam and focuses an image of the beam-shaping aperture 23 on the reticle 26.

The reticle 26 extends in an X-Y plane perpendicular plane to the optical axis AX of the system (the Z-axis extends parallel to the optical axis AX). The reticle 26 comprises multiple subfields (typically many thousands of them, not shown). The reticle 26 typically defines the pattern for an entire layer of a "chip" of a microelectronic device to be formed on a wafer 45. Hence, each subfield on the reticle 26 defines a respective portion of the pattern.

During use for CPB microlithography, the reticle 26 is mounted on an upstream-facing surface of a reticle stage 27 that is movable in the X- and Y-directions. Thus, the reticle 26 can be moved mechanically as required to illuminate all the subfields for exposure. As mentioned above, at a given reticle position, subfields situated within the visual field of the illumination-optical system are illuminated sequentially by deflecting the illumination beam using the subfield-selection deflector 24.

Situated downstream of the reticle 26 are first and second projection lenses 28, 33, respectively, and a deflector 29. The illumination beam illuminating a particular subfield on the reticle 26 becomes a patterned "imaging beam" upon passing through the illuminated portion of the reticle 26. The imaging beam is demagnified by passage through the projection lenses 28, 33 and deflected as required by the deflector 29 to form an image of the illuminated subfield at a proper location on the surface of the wafer 45. (The projection lenses 28, 33 and deflector 29 comprise a "projection-optical system.") So as to be imprintable with the image, the upstream-facing surface of the wafer 45 is coated with a resist that is sensitive (in an image-forming way) to doses of electrons provided by the imaging beam. As the subfield images are being projected onto the wafer 45, the wafer 45 (mounted on an electrostatic wafer chuck 1, according to the invention, which is mounted on a wafer stage 53, as described below and shown schematically in FIG. 4) is moved appropriately by the wafer stage 53. This allows the images to be formed at the correct respective locations to "stitch" together all the images into a contiguous pattern. The image as formed on the wafer 45 is demagnified by the projection-optical system, by which is meant that the image is smaller (by a numerical factor termed the "demagnification factor" of the projection-optical system) than the corresponding pattern as defined by the reticle 26.

Flanking the second projection lens 33 upstream of the wafer 45 are Z-position sensor units 37, 39 used to detect the position of the wafer 45 relative to the second projection lens 33. (Item 37 is a light-source unit, and item 39 is a light-detector unit.) For Z-position detection purposes, the units 37, 39 utilize a "detection beam" 41 of light from the light-source unit 37. The detection beam 41 reflects from the surface of the wafer 45 and is detected by the light-detector unit 39. The Z-position sensor units 37, 39 typically comprise so-called oblique-incidence-type optical-position detectors, as described in Japan Kôkai Patent Document No. Sho 56-42205 and U.S. Pat. No. 4,558,949. More specifically, the detection beam 41 is directed downward from the light-source unit 37 at an angle onto the wafer surface. Light reflected from the wafer surface is reflected at an upward angle to the light-detector unit 39. Thus, the axial "height" of the wafer surface can be detected based on properties of light, reflected from the wafer surface, as detected by the light-detector unit 39.

During exposure, the wafer 45 is mounted to the electrostatic wafer chuck 1. The wafer chuck 1, in turn, is mounted on a wafer stage 53 that can be moved in the X- and Y-directions. By synchronously scanning the reticle stage 27 and wafer stage 53 in opposite directions, multiple rows of subfields are exposed in a sequential manner. Each stage 27, 53 includes respective position sensors (not shown, but each including laser interferometers as known in the art), making it possible to control stage position very accurately. Accurate control of stage positions and of the illumination- and projection-optical systems result in accurate alignment of subfield images on the wafer 45 to form chips on the wafer 45.

The illumination-optical system, projection-optical system, and reticle stage 27 are situated inside a lens column (vacuum chamber) 13. The wafer stage 53 (to which the wafer 45 is mounted) is situated inside a wafer chamber 51. The lens column 13 and wafer chamber 51 are evacuated by a vacuum pump 17 typically connected at the top of the lens column 13 via a duct 15. Operation of the vacuum pump 17 produces a vacuum atmosphere inside the lens column 13 and wafer chamber 51.

Figure 1:
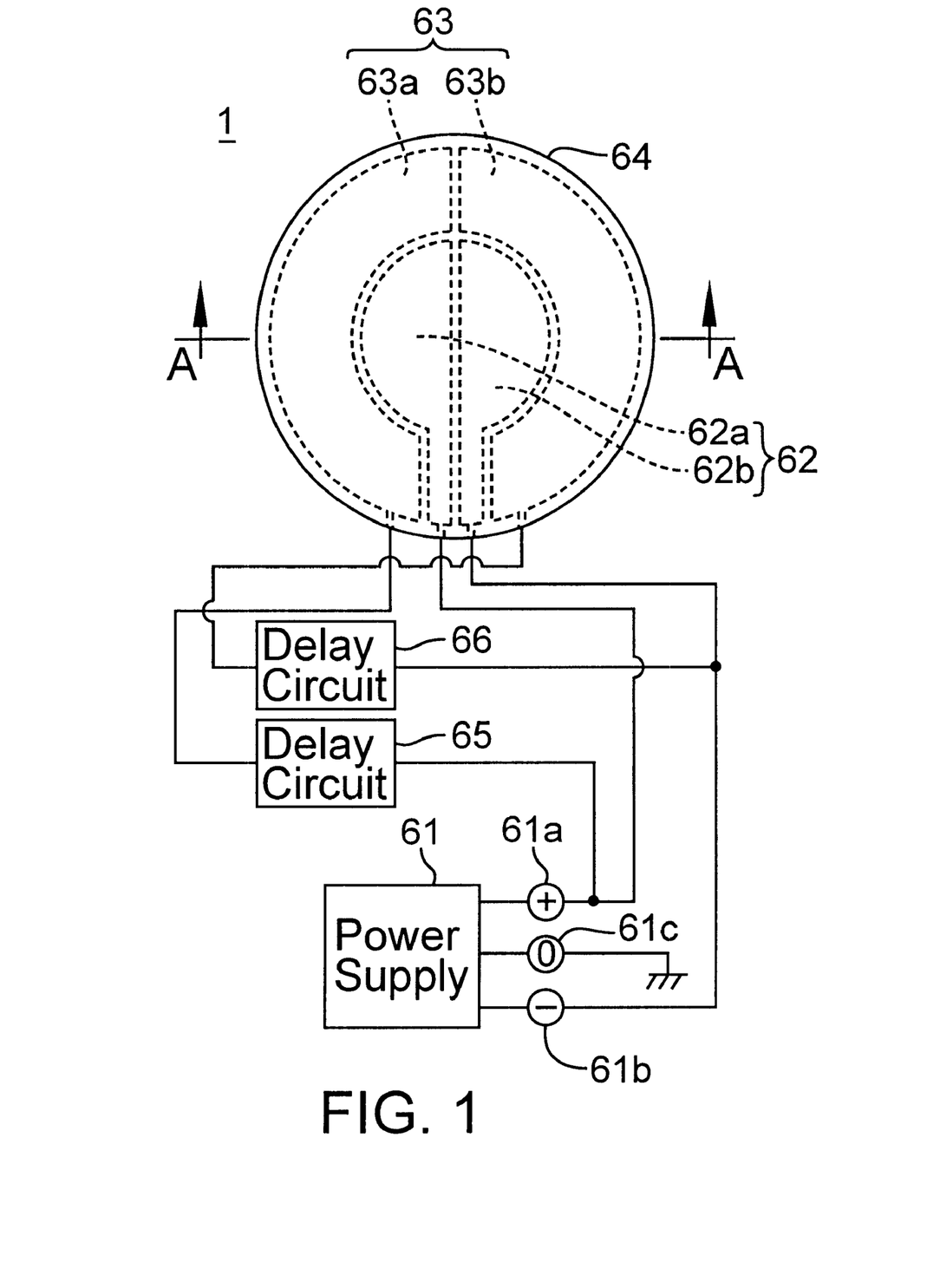
FIG. 1 is a schematic plan view of the general configuration of a representative embodiment of an electrostatic wafer chuck according to the invention.
Figure 2:
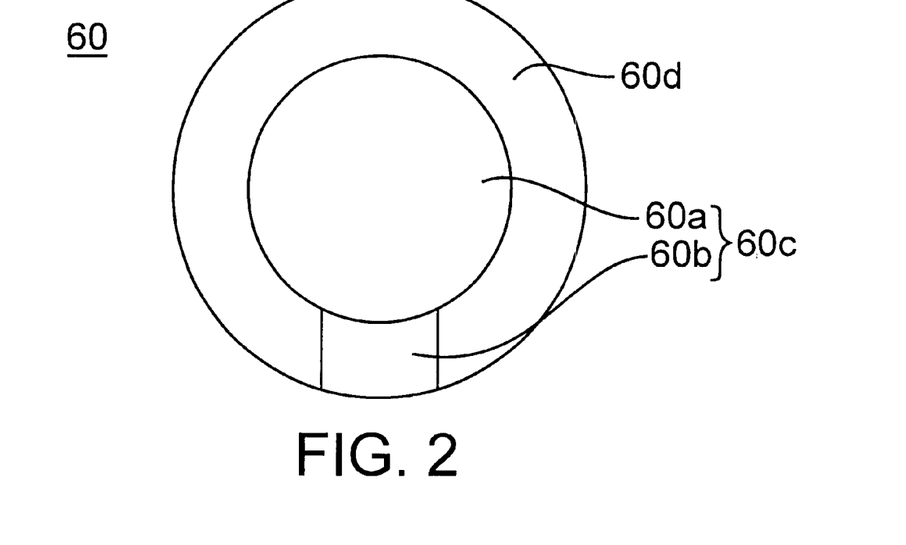
FIG. 2 is a plan view of the base plate of a wafer chuck according to the invention, showing a representative division into regions.

An embodiment of an electrostatic wafer chuck according to the invention now is described with reference to FIGS. 1–3. FIG. 1 schematically depicts the overall chuck configuration; FIG. 2 schematically depicts a plan view of the upstream-facing surface of the base plate of the chuck; and FIG. 3 is a vertical section of the FIG.-1 embodiment along the line A—A.

Figure 3:
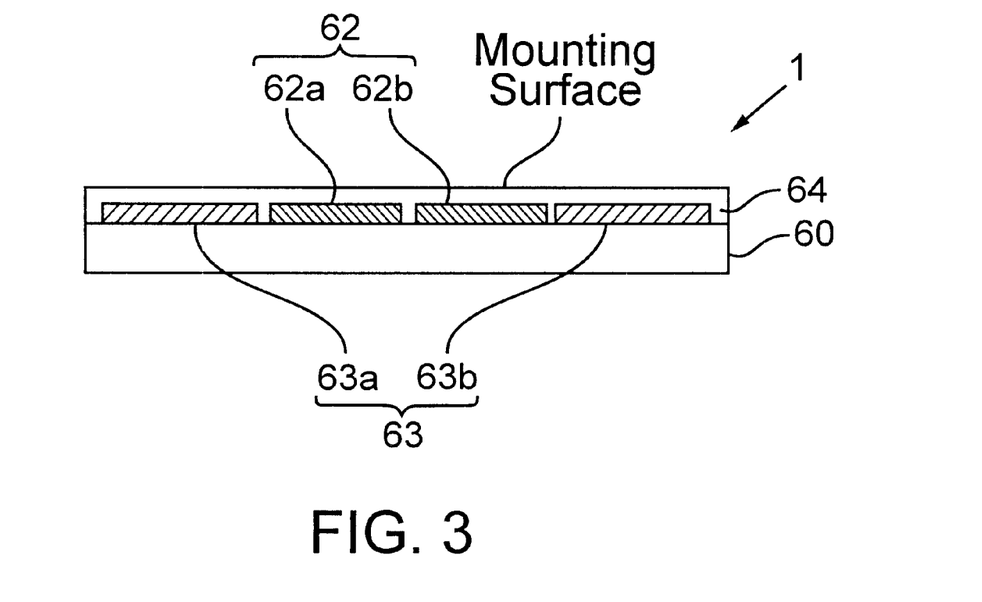
FIG. 3 is a schematic elevational section along the line A—A in FIG. 1.

As shown in FIG. 3, the electrostatic chuck 1 comprises a circular base plate 60 made of an electrically insulating material. On an "upper" surface of the base plate 60 are first and second sets 62, 63, respectively, of electrodes (see also FIG. 1). The first electrode set 62 is connected directly to a chuck-control power supply 61. The second electrode set 63 is connected via delay circuits 65, 66 to the power supply 61. The delay circuits 65, 66 impart a temporal delay to application of voltage from the power supply 61 to the second set 63 of electrodes 63a, 63b, respectively, relative to application of voltage from the power supply 61 to the first set 62 of electrodes 62a, 62b. Overlying the electrode sets 62, 63 is an insulating layer (cover plate) 64 that defines the actual wafer-mounting surface of the chuck 1.

Turning now to FIG. 2, in this embodiment, the base plate 60 can be regarded as including a first region 60c and a second region 60d. The first region 60c comprises a circular central region 60a and a "peripheral segment region" 60b extending radially outward from the central region 60a. The second region 60d (also termed a "general peripheral region") surrounds most of the central region 60a, wherein the central region 60a is surrounded completely by the general peripheral region 60d and the peripheral segment region 60b. These regions also can be regarded as being present on the insulating layer 64, and hence on the wafer-mounting surface of the chuck 1.

Comparing FIGS. 1 and 2 with each other, the first electrode set 62 extends over the first region 60c and the second electrode set 63 extends over the second region 60d.

In this embodiment, the first region 60c is configured so that the central region 60a and the peripheral segment region 60b are contiguous. However, such contiguity is not required. In the FIG.-1 embodiment, the first electrode set 62 comprises the electrodes 62a, 62b, and the second electrode set 63 comprises the electrodes 63a, 63b. In each electrode set 62, 63, the constituent electrodes have equal surface area and have mirror-image profiles.

Referring further to FIG. 1, the electrode 62a is connected to a positive-voltage-output portion 61a of the power supply 61, and the electrode 62b is connected to a negative-voltage-output portion 61b of the power supply 61. The electrode 63a is connected to the positive-voltage-output portion 61a via the delay circuit 65, and the electrode 63b is connected to the negative-voltage-output portion 61b via the delay circuit 66.

By way of example, and not intending to be limiting in any way, a representative voltage supplied by the positive-voltage-output portion 61a is +500 V dc, and a representative voltage supplied by the negative-voltage-output portion 61b is −500 V. The power supply 61 also has a grounded portion 61c. The delay circuits 65, 66 apply these respective voltages to the electrodes 63a, 63b, respectively, at a prescribed delay interval after corresponding voltages are applied to the electrodes 62a, 62b, respectively. An exemplary delay is 500 ms. In other words, 500 ms after application of +500 V to the electrode 62a, a voltage of +500 V is applied to the electrode 63a. Similarly, 500 ms after −500 V is applied to the electrode 62b, a voltage of −500 V is applied to the electrode 63b.

As shown in FIG. 1, the first electrode set 62 and the second electrode set 63 comprise respective electrodes 62a, 62b and 63a, 63b. Both electrodes of each electrode set have identical surface areas. Also, opposite-sign voltages are applied to the electrodes of each electrode set. (For example, positive voltages are applied to the electrodes 62a and 63a, and negative voltages are applied to the electrodes 62b and 63b.) Hence, in this embodiment, it is possible to perform chuck operations even when a wafer 45 is not grounded. In the event of a need to ground the wafer used in the respective microlithography apparatus, it is possible to perform chuck operations by applying positive or negative voltages to the first electrode set 62 and second electrode set 63, without having to divide the electrode sets into equal-area partial electrodes. This makes it possible to minimize the number of lead wires to the chuck 1 to two wires.

Various other aspects of mounting a wafer 45 to the chuck 1 are as follows: Whenever the periphery of a wafer 45 is warped relative to the center of the wafer so as to result in the periphery extending "downward" toward the mounting surface of the chuck 1 (i.e., the center of the wafer is domed "upward" away from the mounting surface), the periphery is closer to the mounting surface than the central region of the wafer 45. Hence, conventionally, as discussed above in the "Background," whenever the wafer is in contact with the chuck 1 a gap would exist between the mounting surface of the chuck 1 and the center portion of the wafer. In such an instance, with a wafer chuck 1 according to the invention, a positive voltage (e.g., +500 Vdc) is applied to the electrode 62a of first electrode set 62, and a negative voltage (e.g., −500 Vdc) is applied to the electrode 62b of the first electrode set 62, to cause attraction of a corresponding portion of the wafer 45 to the peripheral segment region 60b of the mounting surface of the chuck. Such attraction from the peripheral segment region 60b and extending inward toward the central region 60a of the mounting surface causes the gap between the center of the wafer 45 and the mounting surface of the chuck 1 to narrow in the central region 60a. As a result, according to Equation (1), the chuck power P is increased in the central region 60a. The increased chuck power corrects the warp in the wafer 45 as the wafer is mounted to the chuck 1 and ensures good contact of the center of the wafer to the central region 60a of the mounting surface of the wafer chuck 1.

Next, after a delay of 500 ms, a +500 Vdc voltage is applied to the electrode 63a and a −500 Vdc voltage is applied to the electrode 63b. As a result, the general peripheral region 60d attracts the wafer periphery to complete attachment of the wafer 45 to the mounting surface of the chuck 1. The resulting full contact of the under-surface of the wafer 45 with the mounting surface of the chuck 1 substantially improves thermal conduction of heat from all regions of the wafer 45 to the chuck 1. The correspondingly reduced thermal deformation of the wafer 45 yields accompanying improvements in accuracy of the pattern transfer, etching, and other wafer-processing steps conducted on the wafer 45 while the wafer is mounted to the chuck 1. As a candidate insulating material for use in fabricating the cover plate 64, a silicon carbide (SiC) ceramic with added beryllium oxide (BeO) has a higher thermal conduction coefficient than copper. Hence, wafer-temperature increases and variations can be reduced effectively.

Figure 5:
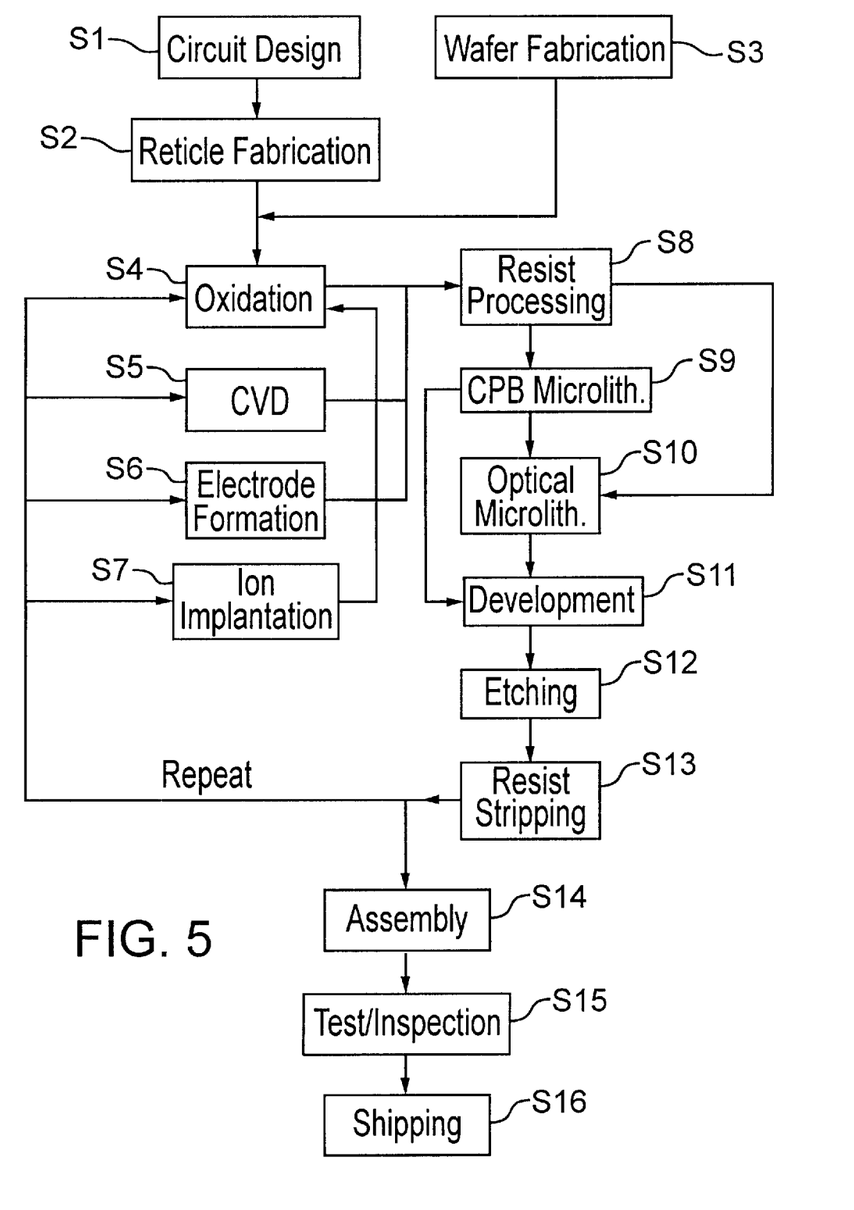
FIG. 5 is a flowchart of steps in a process for manufacturing a microelectronic device such as an integrated circuit "chip."

FIG. 5 is a flowchart of steps in a process for manufacturing a microelectronic device such as a semiconductor chip (e.g., an integrated circuit or LSI device), a display panel (e.g., liquid-crystal panel), a charge-coupled device (CCD), a thin-film magnetic head, or a micro-machine, for example. In step S1, the circuit for the device is designed. In step S2, a reticle for a layer of the circuit is fabricated. During this step, local resizing of pattern elements can be performed to correct for, e.g., proximity effects and space-charge effects. In step S3, a wafer (or other suitable substrate) is fabricated from a material such as silicon.

Steps S4–S13 are directed to wafer-processing steps, also termed "pre-process" steps. In the pre-process steps, the circuit pattern defined on the reticle is transferred onto the wafer by microlithography. More specifically, step S4 is an oxidation step for oxidizing the surface of the wafer. Step S5 involves chemical vapor deposition (CVD) for forming an insulating layer on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. After the wafer is coated with the resist, the wafer is mounted to the surface of an electrostatic wafer chuck according to the invention, as described above. Step S9 involves exposing the resist-coated wafer using CPB microlithography so as to imprint the resist with the reticle pattern, as described elsewhere herein. Step S1 involves exposing the resist as required to a reticle pattern using optical microlithography. Either before or after the CPB microlithography step S9, an auxiliary exposure can be performed to correct for proximity effects from backscattered charged particles. Step S11 involves developing the exposed resist on the wafer. Step S12 involves etching the wafer to remove material from areas where developed resist is absent. Step S13 involves resist stripping, in which remaining resist on the wafer is removed after the etching step. By repeating steps S4–S13 as required, circuit patterns as defined by successive reticles are formed superposedly on the wafer.

Step S14 is an assembly step (also termed a "post-process" step) in which the wafer that has been passed through steps S4–S13 is formed into semiconductor chips. This step can include, e.g., assembling the devices (dicing and bonding) and packaging (encapsulation of individual chips). Step S15 is a testing and inspection step in which any of various operability and qualification tests of the device produced in step S14 are conducted. Afterward, in step S16, devices that successfully pass step S15 are finished, packaged, and shipped.

In view of the foregoing, this invention allows a wafer or other substrate to be mounted securely to a wafer chuck with substantially improved thermal contact of the wafer with the mounting surface of the wafer chuck, even when a peripherally warped wafer is mounted to the chuck. The resulting more complete thermal contact of the wafer with the mounting surface of the wafer chuck reduces temperature increases of central portions of the wafer when mounted to the chuck. Another benefit is correspondingly reduced thermal deformation of the wafer during microlithography and other wafer-processing steps performed on the wafer while the wafer is mounted to the chuck. These effects, in turn, provide more accurate pattern transfer to the wafer, more accurate wafer measurements, and more accurate wafer processing in general.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An electrostatic wafer chuck, comprising:
  a base plate comprising a first region and a second region, the first region including a central region and a peripheral segment region, and the second region including a general peripheral region that, in combination with the peripheral segment region, surrounds the central region;
  an insulating layer overlying the base plate and defining a wafer-mounting surface of the chuck;
  first and second electrode sets situated between the base plate and insulating layer, the first electrode set being located in the first region so as to occupy the central region and peripheral segment region, and the second electrode set being located in the second region so as to occupy the general peripheral region; and
  a power supply connected to the first and second electrode sets, the power supply being configured, at start of energizing the chuck to electrostatically hold a substrate to the wafer-mounting surface, to electrically energize the first electrode set before energizing the second electrode set.

2. The wafer chuck of claim 1, wherein:
  each of the first and second electrode sets comprises respective first and second electrodes; and
  one of the electrodes in each electrode set is connected to a positive-voltage output of the power supply and the other electrode in each electrode set is connected to a negative-voltage output of the power supply.

3. The wafer chuck of claim 2, wherein:
  the first and second electrodes of the first electrode set have planar profiles that are mirror images of each other and have similar surface areas; and
  the first and second electrodes of the second electrode set have planar profiles that are mirror images of each other and have similar surface areas.

4. The wafer chuck of claim 1, further comprising a delay circuit connected between the power supply and the second set of electrodes, the delay circuit being configured to impose a temporal delay to energizing the second set of electrodes relative to a moment at which the first set of electrodes is energized.

5. The wafer chuck of claim 1, wherein the base plate and insulating layer are made of a material comprising silicon carbide (SiC) and beryllium oxide (BeO).

6. The wafer chuck of claim 1, wherein:
  each of the first and second electrode sets comprises respective first and second electrodes; and
  one of the electrodes in each electrode set is connected to a positive-voltage output or a negative-voltage output of the power supply and the other electrode in each electrode set is connected to a grounded portion of the power supply.

7. A charged-particle-beam (CPB) microlithography apparatus, comprising:
  an illumination-optical system situated and configured to direct an illumination charged particle beam to a pattern-defining reticle so as to illuminate a region of the pattern on the reticle;
  a projection-optical system situated and configured to direct an imaging beam, generated by passage of the illumination beam through the illuminated region of the reticle, from the reticle to a sensitive substrate;
  an electrostatic wafer chuck situated to hold the sensitive substrate as the sensitive substrate is being exposed with the pattern by the imaging beam, the wafer chuck comprising (a) a base plate including a first region and a second region, the first region including a central region and a peripheral segment region, and the second region including a general peripheral region that, in combination with the peripheral segment region, surrounds the central region; (b) an insulating layer overlying the base plate and defining a wafer-mounting surface of the chuck; and (c) first and second electrode sets situated between the base plate and insulating layer, the first electrode set being located in the first region so as to occupy the central region and peripheral segment region, and the second electrode set being located in the second region so as to occupy the general peripheral region; and
  a power supply connected to the first and second electrode sets, the power supply being configured, at start of energizing the chuck to electrostatically hold a substrate to the wafer-mounting surface, to electrically energize the first electrode set before energizing the second electrode set.

8. In combination:
  a charged-particle-beam microlithography apparatus; and
  a wafer chuck as recited in claim 1.

9. In a method for performing charged-particle-beam microlithography of a pattern, defined by a reticle, onto sensitive substrate, a method for holding the substrate, comprising:
  providing an electrostatic wafer chuck including (a) a base plate including a first region and a second region, the first region including a central region and a peripheral segment region, and the second region including a general peripheral region that, in combination with the peripheral segment region, surrounds the central region; (b) an insulating layer overlying the base plate and defining a wafer-mounting surface of the chuck; and (c) first and second electrode sets situated between the base plate and insulating layer, the first electrode set being located in the first region so as to occupy the central region and peripheral segment region, and the second electrode set being located in the second region so as to occupy the general peripheral region; and when initiating attachment of the substrate to the wafer chuck, energizing the first electrode set before energizing the second electrode set, then continuing to energize both electrode sets to hold the substrate on the wafer-mounting surface.

10. A method for fabricating a microelectronic device, comprising:

(a) preparing a wafer;

(b) processing the wafer; and (c) assembling devices formed on the wafer during steps (a) and (b), wherein step (b) comprises the steps of (i) applying a resist to the wafer; (ii) exposing the resist; and (iii) developing the resist; and step (ii) comprises providing a CPB microlithography apparatus as recited in claim 7; and using the CPB microlithography apparatus to expose the resist with the pattern defined on the reticle while holding the wafer using the wafer chuck.

* * * * *

UNITED STATES PATENT AND TRADEMARK OFFICE
CERTIFICATE OF CORRECTION

PATENT NO. : 6,487,063 B1
DATED : November 26, 2002
INVENTOR(S) : Nakasuji

It is certified that error appears in the above-identified patent and that said Letters Patent is hereby corrected as shown below:

Column 2,
Line 12, "thickness of" should be -- thickness E*x of --.

Column 6,
Lines 56-57, "60*b*extending" should be -- 60*b* extending --.

Column 8,
Lines 53-54, "Step S1" should be -- Step S10 --.

Signed and Sealed this

Fourth Day of November, 2003

JAMES E. ROGAN
*Director of the United States Patent and Trademark Office*